(12) United States Patent
Mason et al.

(10) Patent No.: US 10,910,748 B2
(45) Date of Patent: Feb. 2, 2021

(54) CABLE SOCKET CONNECTOR ASSEMBLY FOR AN ELECTRONIC

(71) Applicant: TE CONNECTIVITY CORPORATION, Berwyn, PA (US)

(72) Inventors: Jeffery Walter Mason, North Attleboro, MA (US); Michael David Herring, Apex, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/941,575

(22) Filed: Mar. 30, 2018

(65) Prior Publication Data

US 2019/0148858 A1 May 16, 2019

Related U.S. Application Data

(60) Provisional application No. 62/585,268, filed on Nov. 13, 2017, provisional application No. 62/632,383, filed on Feb. 19, 2018.

(51) Int. Cl.
*H01R 12/00* (2006.01)
*H01R 12/82* (2011.01)
(Continued)

(52) U.S. Cl.
CPC ............. *H01R 12/82* (2013.01); *G06F 1/184* (2013.01); *H01R 12/52* (2013.01); *H01R 12/585* (2013.01);
(Continued)

(58) Field of Classification Search
CPC ............... H05K 7/1069; H05K 7/1053; H05K 23/7073; H05K 12/57; H05K 13/518; H05K 13/2421
(Continued)

(56) References Cited

U.S. PATENT DOCUMENTS

| 4,356,532 A | 10/1982 | Donaher et al. |
| 4,997,378 A | 3/1991 | Matsuoka et al. |

(Continued)

FOREIGN PATENT DOCUMENTS

| CN | 102437446 A | 5/2012 |
| WO | 2016112379 A1 | 7/2016 |

OTHER PUBLICATIONS

Offfice Action for corresponding CN Application No. 201811345091.7 dated Dec. 27, 2019 (28 pages).

*Primary Examiner* — Phuong Chi Thi Nguyen

(57) ABSTRACT

A cable socket connector assembly for an electronic system includes a socket assembly having a socket substrate including socket substrate conductors. The socket assembly has socket contacts extending between terminating ends and mating ends with the terminating ends terminated to corresponding socket substrate conductors and the mating ends configured to be terminated to corresponding package contacts of an electronic package of the electronic system. The cable socket connector assembly includes a cable assembly terminated to the socket assembly having an array of cables each having a cable conductor terminated to a corresponding socket substrate conductor. The socket contacts and the corresponding socket substrate conductors define electrical paths between the cable conductors of the cables and the package conductors of the electronic package.

25 Claims, 9 Drawing Sheets

(51) Int. Cl.

| | | |
|---|---|---|
| *H05K 7/10* | (2006.01) | |
| *G06F 1/18* | (2006.01) | |
| *H05K 3/34* | (2006.01) | |
| *H01R 43/02* | (2006.01) | |
| *H01R 13/11* | (2006.01) | |
| *H01R 12/52* | (2011.01) | |
| *H01R 12/58* | (2011.01) | |
| *H01R 12/61* | (2011.01) | |
| *H01R 12/70* | (2011.01) | |
| *H01R 12/79* | (2011.01) | |
| *H01R 12/85* | (2011.01) | |
| *H01R 13/24* | (2006.01) | |
| *H05K 1/02* | (2006.01) | |
| *H05K 1/11* | (2006.01) | |
| *H05K 1/18* | (2006.01) | |
| *H01R 13/05* | (2006.01) | |
| *H01R 12/71* | (2011.01) | |
| *H01L 23/40* | (2006.01) | |

(52) U.S. Cl.
CPC ......... *H01R 12/61* (2013.01); *H01R 12/7005* (2013.01); *H01R 12/7076* (2013.01); *H01R 12/79* (2013.01); *H01R 12/85* (2013.01); *H01R 13/057* (2013.01); *H01R 13/11* (2013.01); *H01R 13/111* (2013.01); *H01R 13/2442* (2013.01); *H01R 43/0256* (2013.01); *H05K 1/0203* (2013.01); *H05K 1/0243* (2013.01); *H05K 1/115* (2013.01); *H05K 1/181* (2013.01); *H05K 3/3436* (2013.01); *H05K 7/1084* (2013.01); *H01L 23/4006* (2013.01); *H01L 2023/405* (2013.01); *H01L 2023/4031* (2013.01); *H01L 2023/4062* (2013.01); *H01L 2023/4081* (2013.01); *H01L 2023/4087* (2013.01); *H01R 12/716* (2013.01); *H01R 13/2464* (2013.01); *H05K 2201/044* (2013.01); *H05K 2201/066* (2013.01); *H05K 2201/10325* (2013.01); *H05K 2201/10393* (2013.01); *H05K 2201/10704* (2013.01); *H05K 2201/10719* (2013.01); *H05K 2201/10734* (2013.01)

(58) Field of Classification Search
USPC ................ 439/71, 331, 79, 83, 540.1, 841.5
See application file for complete search history.

(56) References Cited

U.S. PATENT DOCUMENTS

| | | | |
|---|---|---|---|
| 5,046,954 | A | 9/1991 | Schmedding |
| 5,152,695 | A | 10/1992 | Grabbe et al. |
| 5,176,524 | A | 1/1993 | Mizuno et al. |
| 5,383,787 | A | 1/1995 | Switky et al. |
| 5,403,195 | A | 4/1995 | Thrush et al. |
| 5,499,929 | A | 3/1996 | Miyazawa |
| 5,655,913 | A | 8/1997 | Castaneda et al. |
| 5,783,865 | A | 7/1998 | Higashiguchi et al. |
| 5,791,928 | A | 8/1998 | Lai |
| 5,929,521 | A | 7/1999 | Wark et al. |
| 59,679,848 | | 10/1999 | Johnson et al. |
| 6,007,348 | A | 12/1999 | Murphy |
| 6,046,465 | A | 4/2000 | Wang et al. |
| 6,050,829 | A | 4/2000 | Eldridge et al. |
| 6,213,787 | B1 | 4/2001 | Murphy |
| 6,257,904 | B1 | 7/2001 | Lin |
| 6,347,946 | B1 | 2/2002 | Trobough et al. |
| 6,425,771 | B1 | 7/2002 | Shirai et al. |
| 6,575,766 | B1 | 6/2003 | Xie et al. |
| 6,674,018 | B2 | 1/2004 | Yumi |
| 6,833,613 | B1 | 12/2004 | Akram et al. |
| 6,923,656 | B2 | 8/2005 | Novotny et al. |
| 6,992,496 | B2 | 1/2006 | Winter et al. |
| 6,992,899 | B2 | 1/2006 | Alger et al. |
| 7,053,496 | B2 | 5/2006 | Stone |
| 7,148,428 | B2 | 12/2006 | Meier et al. |
| 7,156,705 | B2 | 1/2007 | Soh |
| 7,177,142 | B2 | 2/2007 | Kabadi et al. |
| 7,200,295 | B2 | 4/2007 | Rolston et al. |
| 7,280,372 | B2 | 10/2007 | Grunndy et al. |
| 7,306,494 | B2 | 12/2007 | Soh |
| 7,307,293 | B2 | 12/2007 | Fjelstad et al. |
| 7,393,214 | B2 | 7/2008 | Di Stefano |
| 7,394,665 | B2 * | 7/2008 | Hamasaki ................ G02B 6/43 361/706 |
| 7,435,102 | B2 | 10/2008 | Goodman |
| 7,442,045 | B1 | 10/2008 | Di Stefano |
| 7,527,529 | B2 | 5/2009 | Ho et al. |
| 7,601,009 | B2 | 10/2009 | Di Stefano |
| 7,652,381 | B2 | 1/2010 | Grundy et al. |
| 7,659,287 | B2 | 4/2010 | Smith et al. |
| 7,744,385 | B2 * | 6/2010 | Scherer ............... H01R 13/6471 439/101 |
| 7,744,414 | B2 * | 6/2010 | Scherer ................ H01R 13/518 439/607.05 |
| 7,750,446 | B2 | 7/2010 | Fjelstad et al. |
| 7,811,096 | B2 | 10/2010 | Takagi |
| 7,874,880 | B2 | 1/2011 | Fedde et al. |
| 7,909,616 | B2 | 3/2011 | Liao |
| 7,955,008 | B1 | 6/2011 | Di Stefano |
| 8,018,733 | B2 | 9/2011 | Jia |
| 8,047,856 | B2 * | 11/2011 | McColloch .......... G02B 6/4285 439/71 |
| 8,079,849 | B2 | 12/2011 | MacDougall et al. |
| 8,167,644 | B2 | 5/2012 | Mason et al. |
| 8,172,615 | B2 | 5/2012 | Mason |
| 8,206,188 | B1 | 6/2012 | Zhang et al. |
| 8,277,255 | B2 | 10/2012 | Consoli et al. |
| 8,338,713 | B2 * | 12/2012 | Fjelstad ............... H01R 12/523 174/251 |
| 8,575,529 | B2 * | 11/2013 | Asahi ................... G02B 6/4201 250/205 |
| 8,592,692 | B2 | 11/2013 | Sharf et al. |
| 8,708,729 | B2 | 4/2014 | An et al. |
| 8,727,808 | B2 | 5/2014 | Mason et al. |
| 8,727,815 | B1 | 5/2014 | Mongold et al. |
| 8,804,342 | B2 | 8/2014 | Behziz et al. |
| 8,821,198 | B2 | 9/2014 | Harada |
| 8,827,730 | B2 | 9/2014 | Ihara |
| 8,867,231 | B2 | 10/2014 | Roitberg et al. |
| 8,968,010 | B2 | 3/2015 | Enclo et al. |
| 9,252,521 | B1 | 2/2016 | Beaman et al. |
| 9,274,295 | B2 | 3/2016 | Droesbeke |
| 9,426,918 | B2 | 8/2016 | Bet-Shliemoun |
| 9,504,159 | B2 | 11/2016 | Lee et al. |
| 9,531,133 | B1 | 12/2016 | Horning et al. |
| 9,692,147 | B1 | 6/2017 | Nekkanty et al. |
| 9,761,520 | B2 | 9/2017 | Rathburn |
| 9,947,634 | B1 | 4/2018 | Wang |
| 10,079,443 | B2 | 9/2018 | Costello et al. |
| 10,135,211 | B2 | 11/2018 | Lloyd et al. |
| 10,348,015 | B2 | 7/2019 | Mason et al. |
| 2004/0080921 | A1 | 4/2004 | Paola |
| 2005/0070131 | A1 | 3/2005 | McLenaghan |
| 2006/0001163 | A1 | 1/2006 | Kobehdari et al. |
| 2006/0292898 | A1 * | 12/2006 | Meredith ................ H05K 1/184 439/65 |
| 2010/0197151 | A1 | 8/2010 | Bet-Shliemoun |
| 2010/0297857 | A1 | 11/2010 | Ito |
| 2011/0207344 | A1 | 8/2011 | McColloch |
| 2011/0287639 | A1 | 11/2011 | Hsu |
| 2013/0182394 | A1 | 7/2013 | Roitberg et al. |
| 2014/0073173 | A1 * | 3/2014 | Yang ................. H01R 13/6461 439/485 |
| 2014/0148058 | A1 | 5/2014 | Mongold et al. |
| 2014/0273551 | A1 * | 9/2014 | Resendez ............ H01R 12/737 439/65 |
| 2015/0079815 | A1 | 3/2015 | Leigh et al. |
| 2016/0233615 | A1 * | 8/2016 | Scholeno ............. H01R 12/712 |

(56) References Cited

U.S. PATENT DOCUMENTS

2017/0302036 A1* 10/2017 Regnier ............... H01R 9/2408
2018/0226735 A1   8/2018 Leigh et al.
2018/0287276 A1  10/2018 Taguchi
2018/0287279 A1  10/2018 Taguchi

* cited by examiner

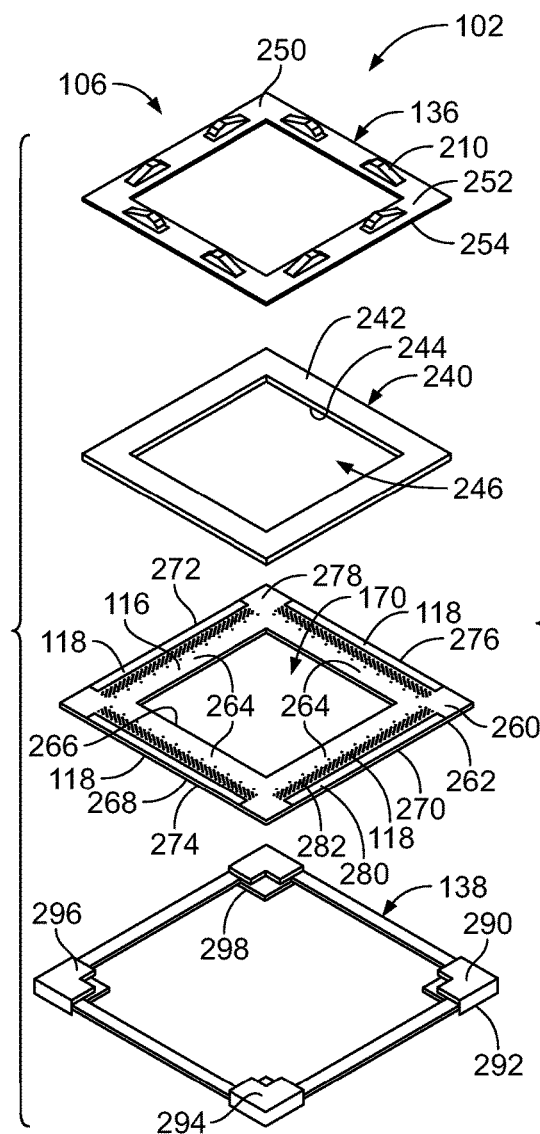
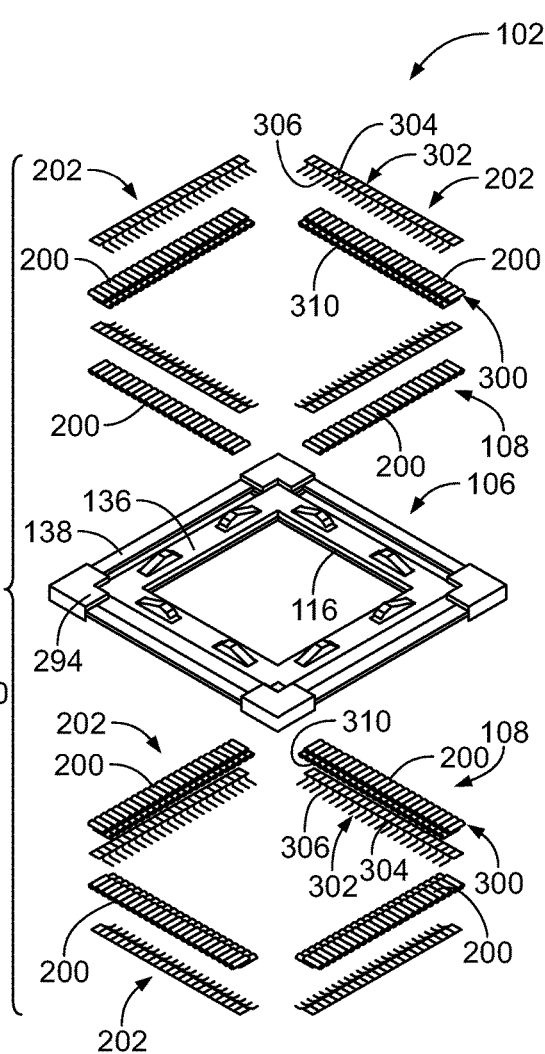
FIG. 7
FIG. 8

CABLE SOCKET CONNECTOR ASSEMBLY FOR AN ELECTRONIC

CROSS REFERENCE TO RELATED APPLICATIONS

This application claims benefit to U.S. Provisional Application No. 62/585,268, filed Nov. 13, 2017, titled "CABLE SOCKET CONNECTOR ASSEMBLY FOR AN ELECTRONIC PACKAGE" and claims benefit to U.S. Provisional Application No. 62/632,383, filed Feb. 19, 2018, titled "SOCKET CONNECTOR FOR AN ELECTRONIC PACKAGE", the subject matter of each are herein incorporated by reference in their entirety.

BACKGROUND OF THE INVENTION

The subject matter herein relates generally to cable socket connector assemblies for an electronic package of an electronic system.

The ongoing trend toward smaller, lighter, and higher performance electrical components and higher density electrical circuits has led to the development of surface mount technology in the design of printed circuit boards and electronic packages. Surface mountable packaging allows for a separable connection of an electronic package, such as an integrated circuit or a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes socket connectors. A socket connector may include a substrate with terminals on one side of the substrate and an array of conductive solder elements, such as a ball grid array (BGA) or a land grid array (LGA), on the opposite side, electrically connected through the substrate by conductive pathways through the substrate. The terminals engage contacts on the electronic package and the solder elements are affixed to conductive pads on a host circuit board, such as a mother board, to electrically join the electronic package with the host circuit board. Conventional architecture provides the socket connector between the electronic package and the host circuit board. The electronic package includes conductors on the bottom of the electronic package and the signals are driven through the bottom of the electronic package to the terminals of the socket connector and then through the socket connector to the host circuit board. The signals are then transitioned to an electrical connector on the host circuit board, such as a high speed electrical connector. The routing of the circuits between the mounting area for the socket connector and the high speed electrical connector and the mounting area for the high speed electrical connector occupy board space on the host circuit board. Additionally, the electrical performance of the electronic system is reduced by the multiple electrical interfaces between the electronic package and the high speed connector. Conventional systems are struggling with meeting signal and power output from the electronic package because there is a need for smaller size and higher number of conductors while maintaining good electrical performance and conventional electronic packages have a limited amount of surface area along the bottom of the electronic package for the conductors.

A need remains for a high speed socket connector assembly having improved electrical performance.

BRIEF DESCRIPTION OF THE INVENTION

In one embodiment, a cable socket connector assembly is provided for an electronic system including a socket assembly having a socket substrate including socket substrate conductors. The socket assembly has socket contacts extending between terminating ends and mating ends with the terminating ends terminated to corresponding socket substrate conductors and the mating ends configured to be terminated to corresponding package contacts of an electronic package of the electronic system. The cable socket connector assembly includes a cable assembly terminated to the socket assembly having an array of cables each having a cable conductor terminated to a corresponding socket substrate conductor. The socket contacts and the corresponding socket substrate conductors define electrical paths between the cable conductors of the cables and the package conductors of the electronic package.

In another embodiment, a cable socket connector assembly is provided for an electronic system including a socket assembly having a socket frame, a socket substrate received in and supported by the socket frame, socket contacts terminated to the socket substrate and a loading member coupled to the socket substrate. The socket substrate has socket substrate conductors defined by circuits of the substrate. The socket contacts extend between terminating ends and mating ends and include spring beams at the mating ends with the terminating ends terminated to corresponding socket substrate conductors. The mating ends are configured to be terminated to corresponding package contacts of an electronic package of the electronic system with the spring beams being deflectable between the socket substrate and the electronic package to spring load the mating ends in electrical contact with the corresponding package contacts. The loading member has at least one loading beam imparting a downward spring force on the socket substrate to deflect the spring beams of the socket contacts. The cable socket connector assembly includes a cable assembly terminated to the socket assembly having an array of cables each having a cable conductor terminated to a corresponding socket substrate conductor. The socket contacts and the corresponding socket substrate conductors define electrical paths between the cable conductors of the cables and the package conductors of the electronic package.

In a further embodiment, an electronic system is provided including a host circuit board having host contacts, an electronic package coupled to the host circuit board, and a cable socket connector assembly coupled to the electronic package. The electronic package has a substrate including upper package contacts on an upper surface of the substrate and lower package contacts on a lower surface of the substrate being electrically connected to corresponding host contacts. The cable socket connector assembly has a socket assembly and a cable assembly terminated to the socket assembly. The socket assembly includes a socket substrate having socket substrate conductors and socket contacts terminated to corresponding socket substrate conductors. The socket contacts have mating ends terminated to corresponding upper package contacts. The cable assembly has an array of cables each having a cable conductor terminated to a corresponding socket substrate conductor.

BRIEF DESCRIPTION OF THE DRAWINGS

FIG. 7 is an exploded view of a portion of the cable socket connector assembly showing the socket assembly.

FIG. 8 is an exploded view of the cable socket connector assembly showing the socket assembly and the cable assembly.

DETAILED DESCRIPTION OF THE INVENTION

Figure 1:
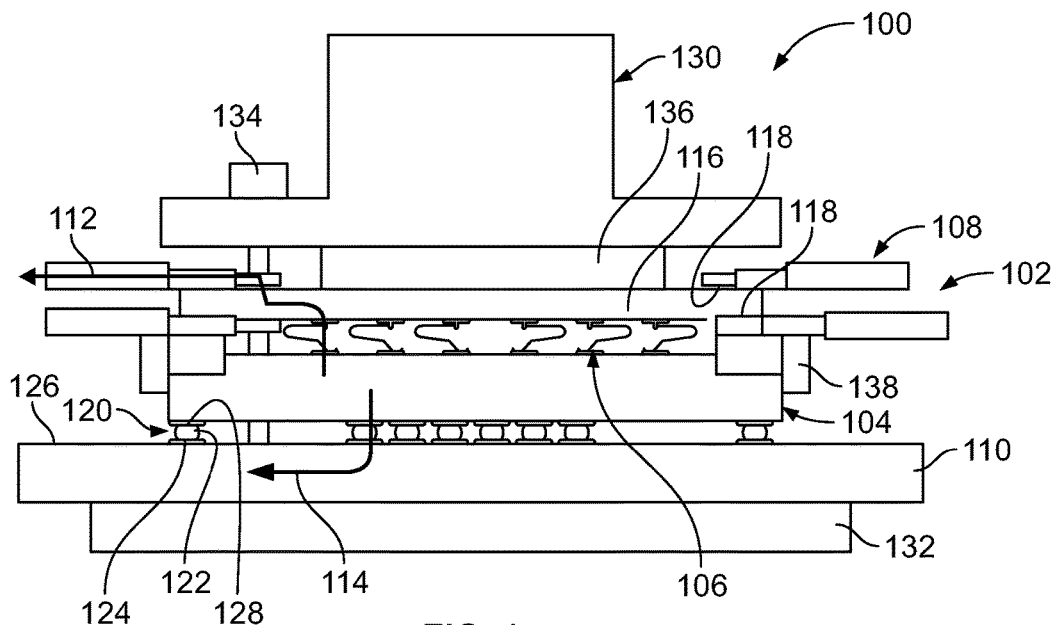
FIG. 1 is a schematic view of an electronic system including a contact socket connector assembly formed in accordance with an exemplary embodiment.

FIG. 1 is a schematic view of an electronic system 100 formed in accordance with an exemplary embodiment. The electronic system 100 includes a cable socket connector assembly 102 electrically connected to an electronic package 104, such as an integrated circuit. The cable socket connector assembly 102 includes a socket assembly 106 configured to be directly electrically connected to the electronic package 104 and a cable assembly 108 directly electrically connected to the socket assembly 106. The socket assembly 106 electrically connects the cable assembly 108 with the electronic package 104 for routing away from the electronic package 104. In an exemplary embodiment, the socket assembly 106 is coupled to a top of the electronic package 104 and the bottom of the electronic package 104 is coupled to a host circuit board 110, such as a motherboard. The electronic system 100 allows connection of the socket assembly 106 to the top of the electronic package 104 and connection of the bottom of the electronic package 104 to the host circuit board 110 to increase performance and design efficiency by increasing the number of connection positions to the electronic package 104. In an exemplary embodiment, the components are coupled to multiple sides of the electronic package 104 to increase density of the electronic system 100 and shorten electrical paths of the electronic system 100. The arrangement may reduce the number of electrical interfaces along the signal paths to enhance electrical performance of the electronic system 100. For example, high speed data signals may be transferred directly from the electronic package 104 to the cable assembly 108 through the socket assembly 106 rather than being first routed through the host circuit board 110.

In an exemplary embodiment, electrical paths 112 from the electronic package 104 to the cable assembly 108 pass through the socket assembly 106 and are not routed through the host circuit board 110. For example, in the illustrated embodiment, the electrical paths 112 are high speed electrical paths routed to the cable assembly 108 through the socket assembly 106, whereas other electrical paths 114, such as low speed electrical paths and power electrical paths, are routed between the electronic package 104 and the host circuit board 110 through an interface 120. In the illustrated embodiment, the interface 120 is a ball grid array (BGA) having solder balls 122 soldered between host contacts 124 on an upper surface 126 of the host circuit board 110 and lower package contacts 128 on the lower surface of the electronic package 104. However, other types of interfaces may be utilized in alternative embodiments, such as a land grid array (LGA). In various alternative embodiments, a socket connector (not shown) may be provided at the interface 120 between the electronic package 104 and the host circuit board 110. Optionally, the electrical paths 114 may include high speed electrical paths.

In an exemplary embodiment, the socket assembly 106 includes a socket substrate 116 having socket substrate conductors 118 that provide electrical paths between the electronic package 104 and the cable assembly 108. The socket substrate 116 may be a printed circuit board and the socket substrate conductors 118 may be circuits, pads, traces, vias, and the like of the printed circuit board. The cable assembly 108 may be terminated directly to the socket substrate conductors 118, such as by soldering to the socket substrate conductors 118. The socket substrate conductors 118 may be electrically connected to the electronic package 104 using contacts, pins, solder balls, conductive elastomeric columns, or other intervening conductive elements. In an exemplary embodiment, the socket substrate 106 includes an interface on the bottom side for electrical connection directly to the electronic package 104, such as an LGA interface, a BGA interface, and the like. As such, the socket substrate 106 electrically connects the cables of the cable assembly 108 to the top of the electronic package 104.

In an exemplary embodiment, the electronic system 100 includes a heat sink 130 for dissipating heat from one or more of the components of the electronic system 100, such as from the electronic package 104 and/or the socket assembly 106. In the illustrated embodiment, the heat sink 130 is provided above the socket assembly 106 such that the socket assembly 106 is provided in the space between the heat sink 130 and the electronic package 104. Optionally, the heat sink 130 may be mounted to the host circuit board 110 and/or a mounting block 130 below the host circuit board 110. For example, the heat sink 130 may be secured to the mounting block 132 using fasteners 134. Optionally, the mounting block 132 supports the heat sink 130 and/or the host circuit board 110. The electronic package 104 and the socket assembly 106 may be sandwiched between the heat sink 130 and the host circuit board 110 and/or the mounting block 132.

Optionally, the components may include one or more compressible interfaces therebetween. For example, the socket assembly 106 may include a separable, compressible interface with the top of the electronic package 104. The socket assembly 106 may be spring biased against the electronic package 104 when the heat sink 130 is coupled to the mounting block 132. In an exemplary embodiment, the cable socket connector assembly 102 includes a loading member 136 between the heat sink 130 and the socket assembly 106. The loading member 136 may be spring loaded against the socket assembly 106 to mechanically press and hold the socket assembly 106 against the electronic package 104. In an exemplary embodiment, the cable socket connector assembly 102 includes a socket frame 138 that supports components of the cable socket connector assembly 102. For example, the socket frame 138 may support the socket assembly 106. The socket frame 138 may support the electronic package 104. The socket frame 138 may support the cable assembly 108. In an exemplary embodiment, the socket frame 138 may limit or stop compression at the compressible interface to prevent damage to various components. The socket frame 138 may guide or position various components relative to each other. The socket frame 138 may hold various components together for mounting to other components.

Figure 2:
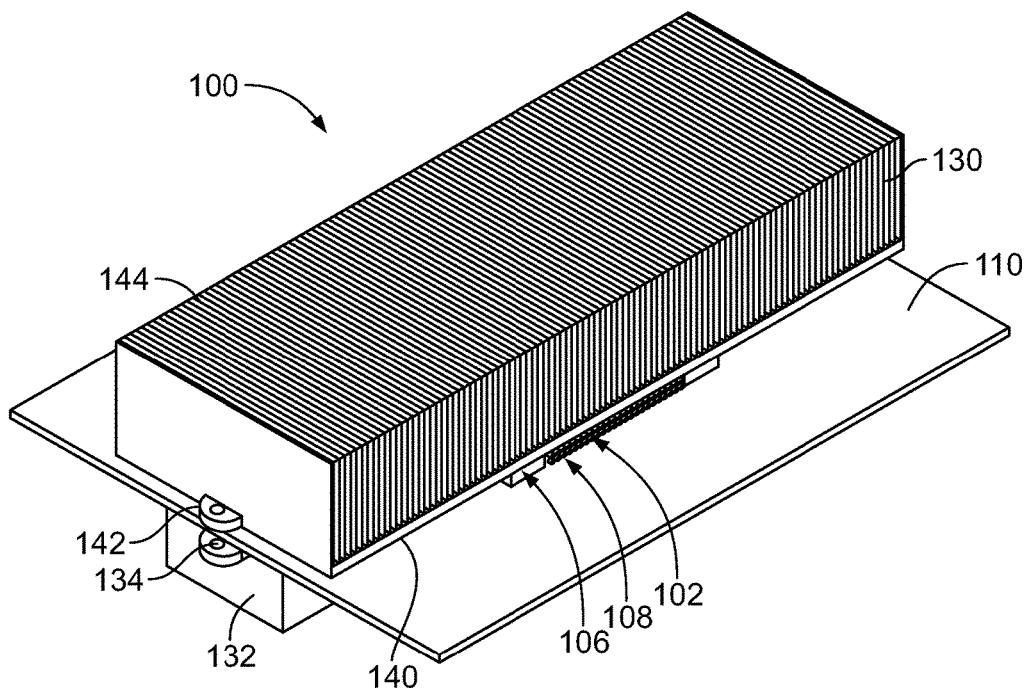
FIG. 2 is a perspective view of the electronic system showing the contact socket connector assembly in accordance with an exemplary embodiment.
Figure 3:
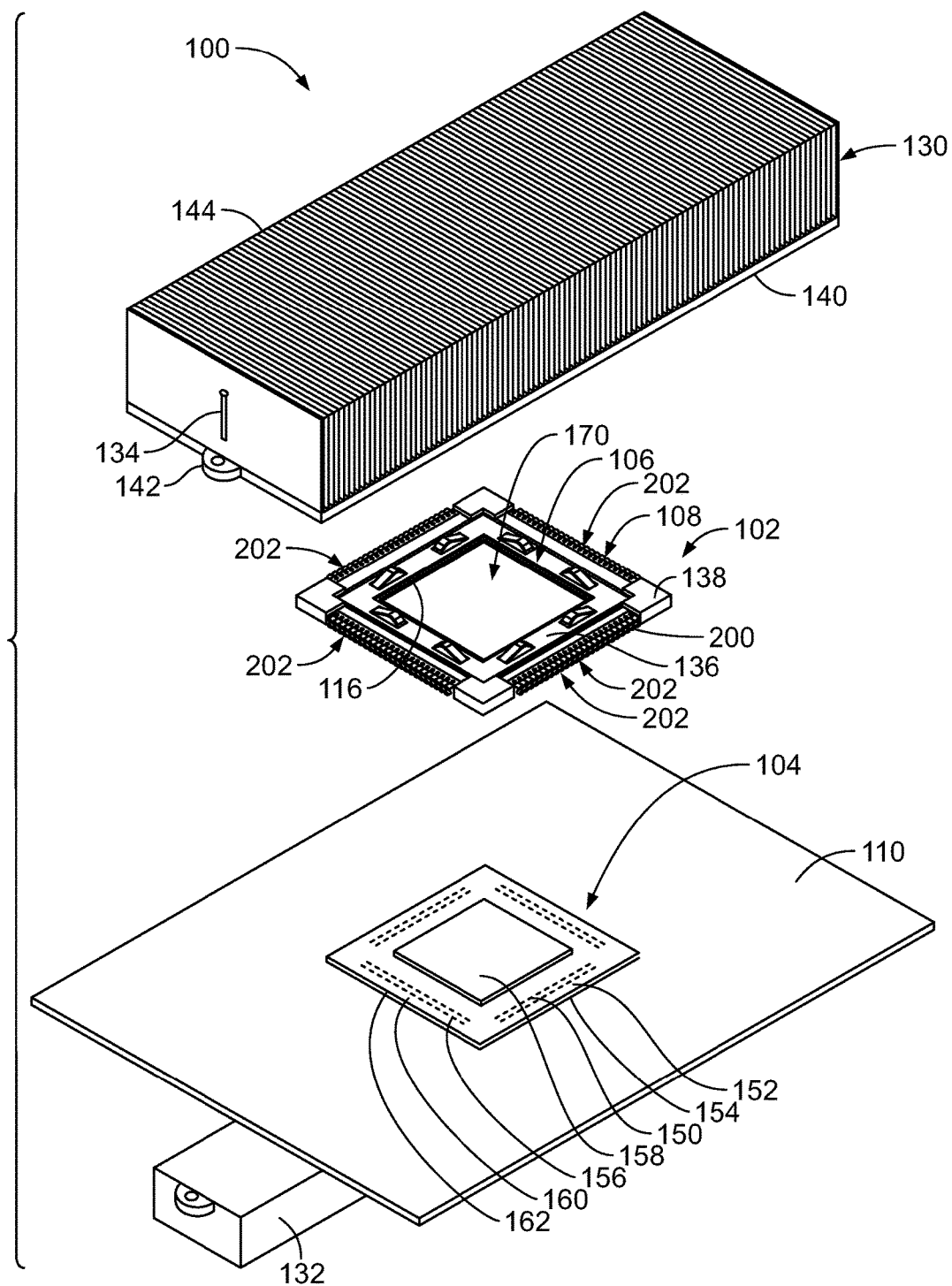
FIG. 3 is an exploded view of the electronic system showing a socket assembly and a cable assembly of the contact socket connector assembly in accordance with an exemplary embodiment.

FIG. 2 is a perspective view of the electronic system 100 in accordance with an exemplary embodiment. FIG. 3 is an exploded view of the electronic system 100 in accordance with an exemplary embodiment. FIG. 3 illustrates the electronic package 104 mounted to the host circuit board 110. Optionally, the electronic package 104 may be soldered to the host circuit board 110; however, the electronic package 104 may be mechanically and/or electrically coupled to the host circuit board 110 by other means in alternative embodiments. The cable socket connector assembly 102 is poised for coupling to the electronic package 104.

In the illustrated embodiment, the heat sink 130 is positioned above the cable socket connector assembly 102 and is configured to be mounted to the mounting block 132 below the host circuit board 110. In other various embodiments, the electronic system 100 may be provided without the heat sink 130 and/or without the mounting block 132. For example, the cable socket connector assembly 102 may be mounted to and supported by the host circuit board 110 above the electronic package 104, such as using clips, fasteners or other securing components.

The heat sink 130 includes a base 140 at a bottom of the heat sink 130. The heat sink 130 includes mounting features 142 at the base 140 used for securing the heat sink 130 to the mounting block 132. In the illustrated embodiment, the mounting features 142 are flanges or tabs extending from opposite ends of the base 140 having openings that receive the fasteners 134. Other types of mounting features may be used in alternative embodiments. In an exemplary embodiment, the heat sink 130 includes a plurality of heat dissipating fins 144 for dissipating heat from the heat sink 130. The heat dissipating fins 144 may be parallel plates. Other types of heat dissipating fins may be provided in alternative embodiments, such as posts.

In an exemplary embodiment, the electronic package 104 is an integrated circuit component, such as an application-specific integrated circuit (ASIC); however, other types of electronic packages may be used in alternative embodiments, such as chips, processors, memory devices and the like. The electronic package 104 includes a substrate 150 having an upper surface 152 and a lower surface 154. The electronic package 104 includes package contacts 156 defined by circuits of the substrate 150. In an exemplary embodiment, the package contacts 156 are provided on the upper surface 152 and the lower surface 154. The package contacts 156 may include pads, traces, vias, or other types of contacts.

In the illustrated embodiment, the electronic package 104 includes an electronic component 158, such as a chip, on the upper surface 152. The electronic component 158 may be electrically connected to the package contacts 156 through traces or circuits of the substrate 150. In the illustrated embodiment, the electronic component 158 is approximately centered on the substrate 150 such that platforms 160 are defined on all four sides of the electronic component 158. The platforms 160 extend to edges 162 of the substrate 150 defining a perimeter of the substrate 150. The size and shape of the substrate 150 and the size and shape of the electronic component 158 defines the size and shapes of the platforms 160 and thus the amount of usable substrate area on the upper surface 152 for the package contacts 156.

The cable socket connector assembly 102 may be preassembled and mounted to the electronic package 104 and/or the host circuit board 110 after the electronic package 104 is mechanically and electrically coupled to the host circuit board 110. For example, the cable assembly 108 may be terminated to the socket assembly 106 in the socket frame 138 for coupling to the electronic package 104. In an exemplary embodiment, the socket frame 138 supports the socket assembly 106 and the loading member 136. In an exemplary embodiment, the socket assembly 106 includes a socket opening 170 therethrough that receives the electronic component 158. Optionally, a portion of the electronic component 158 passes through the socket opening 170 to interface with the heat sink 130.

The cable assembly 108 is terminated to the socket assembly 106 and thus supported by the socket frame 138. In an exemplary embodiment, the cable assembly 108 includes a plurality of cables 200 each terminated to the socket assembly 106. For example, the cables 200 may be terminated directly to the socket substrate 116 such as by soldering the cables 200 to the socket substrate conductors 118 of the socket substrate 116. Any number of cables 200 may be provided, depending on the particular application. For example, a greater number of cables 200 may be utilized in higher density applications to provide a greater number of electrical paths to and from the electronic package 104. Optionally, the cables 200 may be shielded cables provide electrical shielding for the electrical path. Optionally, the cables 200 may be differential pair cables where each cable 200 includes a pair of cable conductors. In an exemplary embodiment, the cables 200 may be terminated to an upper surface and/or a lower surface of the socket substrate 116. In an exemplary embodiment, the cable assembly 108 includes a plurality of cable subassemblies 202. Each cable subassembly 202 includes a plurality of cables 200 arranged in an array. Each cable subassembly 202 may be terminated to a corresponding area of the socket substrate 116. For example, an upper cable subassembly 202 may be terminated to the upper surface of the socket substrate 116 and a lower cable subassembly 202 may be terminated to the lower surface of the socket substrate 116. In an exemplary embodiment, the cable subassemblies 202 may be routed from different sides of the socket substrate 116. For example, in the illustrated embodiment, the cable assembly 108 includes cable subassemblies 202 terminated to all four sides of the socket substrate 116 extending in four different directions (e.g., north/south/east/west). However, in other various embodiments, fewer cable subassemblies 202 may be provided, such as cable subassemblies 202 extenting from two opposite sides in opposing directions (e.g., north/south). The cables 200 may extend generally horizontally, such as generally in plane with the socket assembly 106 and/or parallel to the host circuit board 110. Optionally, different cable subassemblies 202 may be routed to different components. The cables 200 of the various cable subassemblies 202 may be bound together for cable management, such as using cable straps, clips, ties and the like.

Figure 4:
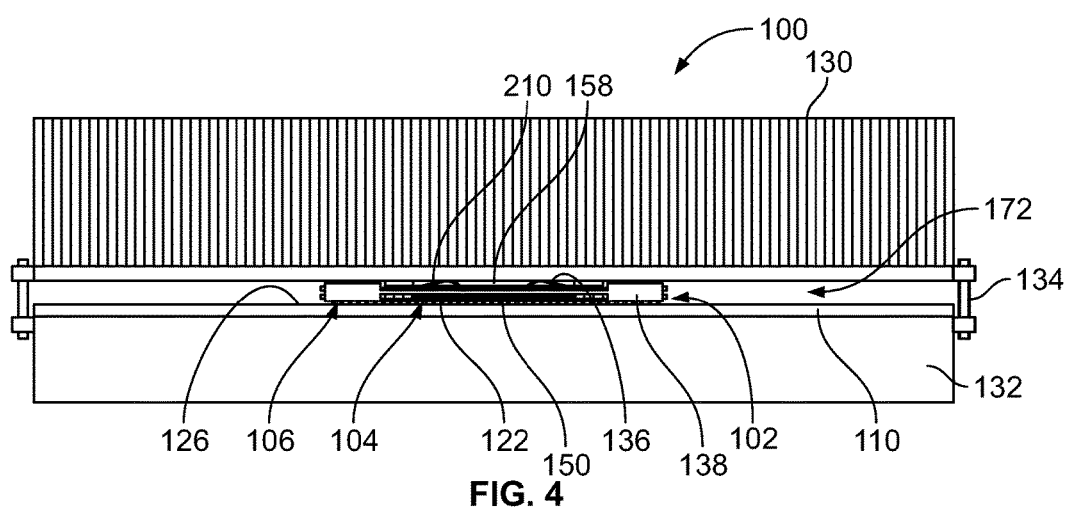
FIG. 4 is a side view of the electronic system in accordance with an exemplary embodiment.
Figure 5:
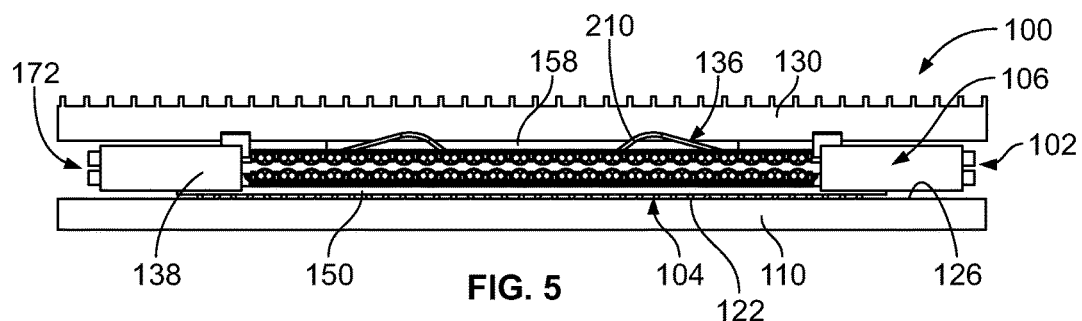
FIG. 5 is an enlarged view of a portion of the electronic system in accordance with an exemplary embodiment.

FIG. 4 is a side view of the electronic system 100 in accordance with an exemplary embodiment. FIG. 5 is an enlarged view of a portion of the electronic system 100 in accordance with an exemplary embodiment. During assembly, the electronic package 104 is positioned above the host circuit board 110 and mechanically and electrically connected to the upper surface 126 of the host circuit board 110, such as using the solder balls 122.

During assembly, the cable socket connector assembly 102 is positioned above the electronic package 104 and mechanically and electrically connected to the upper surface of the electronic package 104. The socket frame 138 may align and position the cable socket connector assembly 102 relative to the electronic package 104. When assembled, a portion of the electronic component 158 extends through the cable socket connector assembly 102 for interfacing with the heat sink 130.

During assembly, the heat sink 130 is positioned above the cable socket connector assembly 102 and the electronic package 104. In an exemplary embodiment, the heat sink 130 is in thermal contact with an upper surface of the electronic component 158 to dissipate heat from the electronic component 158. When assembled, the electronic package 104 and the cable socket connector assembly 102 is positioned in a gap 172 between the heat sink 130 and the host circuit board 110.

During assembly, the heat sink 130 is secured to the mounting block 132 using the fasteners 134. Tightening of the fasteners 134 may pull the heat sink 130 closer to the host circuit board 110. Optionally, the bottom of the heat sink 130 presses against the cable socket connector assembly 102 to load the cable socket connector assembly 102 against the electronic package 104. For example, the loading member 136 at the top of the cable socket connector assembly 102 engages the bottom of the heat sink and provides a loading force in the downward direction to load the cable socket connector assembly 102 against the electronic package 104.

In an exemplary embodiment, the loading member 136 includes one or more loading beams 210 configured to be spring biased against the heat sink 130. The loading beams 210 may be connected together, such as by a plate or may be separate loading beams 210, such as connected to the socket assembly 106 or to the heat sink 130. The loading beams 210 impart a downward spring force on the socket substrate 116 to bias the socket assembly 106 against the electronic package 104. For example, in an exemplary embodiment, the socket assembly 106 may include a plurality of socket contacts 220 (shown in FIG. 6) between the socket substrate 116 and the substrate 150 of the electronic package 104. The socket contacts 220 may be compressible. The socket contacts 220 may define a separable mating interface with the electronic package 104. The socket contacts 220 may be LGA contacts. Downward movement of the cable socket connector assembly 102 during assembly may spring load the socket contacts 220 against the electronic package 104 to ensure good electrical connection between the socket assembly 106 and the electronic package 104.

In an exemplary embodiment, the socket frame 138 may limit compression or downward movement of the heat sink 130. The socket frame 138 may limit downward movement of the cable socket connector assembly 102 relative to the electronic package 104, such as by bottoming out against the host circuit board 110. The socket frame 138 may prevent damage to the electronic package 104. The socket frame 138 may prevent damage to the socket contacts 220.

Figure 6:
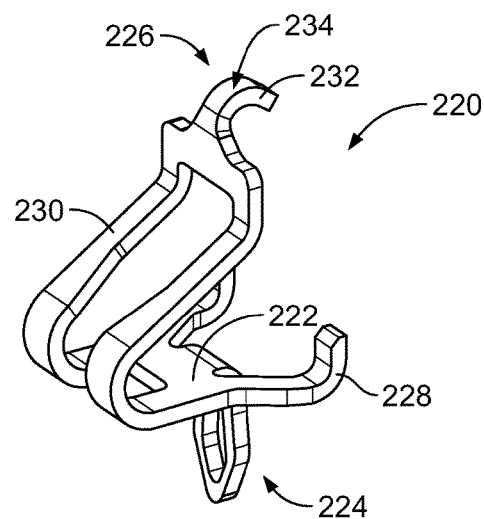
FIG. 6 is a perspective view of a socket contact of the socket assembly in accordance with an exemplary embodiment.

FIG. 6 is a perspective view of the socket contact 220 in accordance with an exemplary embodiment. The socket contact 220 includes a base 222 between a terminating end 224 and a mating end 226. The terminating end 224 is configured to be terminated to the socket substrate 116. The mating end 226 is configured to be mated with the electronic package 104. In the illustrated embodiment, the terminating end 224 includes a compliant pin, such as an eye of the needle contact, configured to be press-fit into a plated via of the socket substrate 116. Other types of terminating ends 224 may be provided in alternative embodiments. In the illustrated embodiment, the socket contact 220 includes stabilizing beams 228 extending from the base 222 at the terminating end 224. The stabilizing beams 228 are configured to engage the socket substrate 116 to stabilize the socket contact 220 on the socket substrate 116.

The socket contact 220 includes a spring beam 230 extending from the base 222 at the mating end 226. The spring beam 230 is deflectable. In the illustrated embodiment, the spring beam 230 includes two beam arms separated by a gap; however, the spring beam 230 may have other shapes in alternative embodiments, including a single beam arm. In an exemplary embodiment, the socket contact 220 includes a hook 232 at the distal end thereof defining a mating interface 234 for mating with the corresponding package contact 156 of the electronic package 104. In an exemplary embodiment, the mating interface 234 is a separable mating interface. The spring beam 230 may be resiliently deflected during loading the spring biased the hook 232 against the package contact 156 to ensure electrical connection between the socket contact 220 and the package contact 156.

The socket contact 220 may have other shapes and features in alternative embodiments. For example, the socket contact 220 may include a solder tail at the mating end 226 configured to be soldered to the electronic package 104. In other various embodiments, the socket contact 220 may be a solder ball for soldering the socket assembly 106 to the electronic package 104.

FIG. 7 is an exploded view of a portion of the cable socket connector assembly 102 showing the socket assembly 106. In an exemplary embodiment, the socket assembly 106 includes the socket substrate 116, the socket frame 138, the loading member 136 and an insulator 240 positioned between the socket substrate 116 and the loading member 136.

The insulator 240 electrically isolates the socket substrate 116 from the loading member 136. The insulator 240 includes an upper surface 242 and a lower surface 244. The lower surface 244 may rest on the socket substrate 116. The upper surface 242 may support the loading member 136. The insulator 240 includes an insulator opening 246 aligned with the socket opening 170 in the socket substrate 116. The insulator 240 may be sized and shaped similar to the loading member 136 and/or the socket substrate 116. The insulator 240 may have other shapes in alternative embodiments. In other various embodiments, rather than a single insulator 240 the socket assembly 106 may include a plurality of insulators, such as standoffs mounted to the socket substrate 116 used to support the loading member 136.

The loading member 136 includes a main body 250 having an upper surface 252 and a lower surface 254. The main body 250 may be a plate. The loading beams 210 extend above the upper surface 252 for interfacing with the heat sink 130. Alternatively, the loading beams 210 may extend below the lower surface 254 for interfacing with the insulator 240. The lower surface 254 rests on the insulator 240. The main body 250 includes the loading beams 210. In an exemplary embodiment, the loading member 136 is a stamped and formed part having the loading beams 210 stamped from the main body 250. Any number of loading beams 210 may be provided. Optionally, the loading beams 210 may be dispersed around the perimeter of the loading member 136 to spread loading forces around the loading member 136. For example, in the illustrated embodiment, the loading beams 210 are provided on all four sides of the main body 250. Optionally, the loading beams 210 may extend in different directions for load canceling of the compressive load from the heat sink 130. The loading member 136 may have other shapes and features in alternative embodiments. The loading member 136 imparts an activation spring load on the socket assembly 106 to load or press the socket assembly 106 against the electronic package 104. For example, the activation spring load may be a higher force than the spring force of the socket contacts 220 to overcome the spring force and compress the socket contacts 220 to load the socket contacts 220 against the electronic package 104.

In an alternative embodiment, rather than providing a single loading member above the socket substrate 116, the socket assembly 106 may include a plurality of individual loading beams mounted directly to the socket substrate 116. For example, the loading beams 210 may be similar to the socket contacts 220 and configured to be mounted to the upper surface of the socket substrate 116 to be spring biased against the heat sink 130 when the heat sink 130 is loaded against the socket assembly 106. In other various embodiments, the loading beams 210 may be coil springs between the heat sink and the socket substrate 116. In alternative embodiments, rather than being part of the socket assembly 106, the loading beams 210 may be part of the heat sink 130.

The socket substrate 116 may be a printed circuit board and the socket substrate conductors 118 may be circuits of the printed circuit board. The socket substrate 116 includes an upper surface 260 and a lower surface 262. The socket opening 170 extends through the socket substrate 116 between the upper surface 260 and the lower surface 262. The socket substrate 116 includes platforms 264 surrounding the socket opening 170. The platforms 264 are defined by inner edges 266 surrounding the socket opening 170 and outer edges 268 along the perimeter of the socket substrate 116. The socket substrate 116 includes a first side wall 270 and a second side wall 272 opposite the first side wall 270. The socket substrate 116 includes a first end wall 274 and a second end wall 276 opposite the first end wall 274. In an exemplary embodiment, the socket substrate 116 includes corners 278 at the intersections between the side walls 270, 272 and the end walls 274, 276. In the illustrated embodiment, the socket substrate 116 is generally rectangular; however, the socket substrate 116 may have other shapes in alternative embodiments.

The socket substrate conductors 118 include pads, traces, vias, and the like extending along one or more layers of the socket substrate 116. In an exemplary embodiment, portions of various socket substrate conductors 118 may be exposed on the upper surface 260 and portions of various socket substrate conductors 118 may be exposed on the lower surface 262.

In an exemplary embodiment, the socket substrate conductors 118 include contact pads 280 for electrical connection with corresponding cables 200. The contact pads 280 may be provided at or near one or more of the outer edges 268. For example, in the illustrated embodiment, the contact pads 280 are provided along the first side wall 270, the second side wall 272, the first end walls 274 and the second end wall 276 for mating with corresponding cables 200. The contact pads 280 may be provided on the upper surface 260 and/or the lower surface 262 for electrical connection with corresponding cables 200.

In an exemplary embodiment, the socket substrate conductors 118 include plated vias 282 for electrical connection with corresponding socket contacts 220. The plated vias 282 may be associated with corresponding contact pads 280. The plated vias 282 may be provided at the upper surface 260 and/or the lower surface 262. In an exemplary embodiment, the socket contacts 220 are coupled to the corresponding vias 282 at the lower surface 262 to extend below the socket substrate 116 for electrical connection with the electronic package 104.

The socket frame 138 includes a top 290 and a bottom 292. The socket frame 138 includes support members 294 for supporting the socket substrate 116. In the illustrated embodiment, the support members 294 are provided at the corners of the socket frame 138 for supporting the corners 278 of the socket substrate 116. In an exemplary embodiment, the socket frame 138 includes one or more heat sink locating surfaces 296 at the top 290 configured to engage and locate the heat sink 130 relative to the socket frame 138. The heat sink locating surfaces 296 may define stop surfaces used to stop lowering of the heat sink 130 toward the socket assembly 106. In an exemplary embodiment, the socket frame 138 includes one or more electronic package locating surfaces 298 at the bottom 292 configured to engage and locate the electronic package 104 relative to the socket frame 138. The electronic package locating surfaces 298 may locate the electronic package 104 relative to the socket substrate 116. The electronic package locating surfaces 298 may bottom out against the electronic package 104 during loading of the socket assembly 106 onto the electronic package 104 to prevent damage to the socket contacts 220. Optionally, the bottom 292 may be configured to bottom out against the host circuit board 110 during assembly to prevent damage to the electronic package 104, the loading beams 210 and/or the socket contacts 220.

FIG. 8 is an exploded view of the cable socket connector assembly 102 showing the socket assembly 106 and the cable assembly 108. The cable assembly 108 includes a plurality of the cable subassemblies 202 configured to be terminated to the socket assembly 106. The socket assembly 106 is shown in an assembled state with the socket substrate 116 held in and supported by the socket frame 138 and with the loading member 136 and the insulator 240 coupled to the socket substrate 116. When the loading member 136 and the insulator 240 are coupled to the socket substrate 116, the contact pads 280 are exposed for termination of the cables 200 to the socket substrate 116. The support members 294 may be used to locate the insulator 240 and the loading member 136.

Each cable subassembly 202 includes an array 300 of the cables 200. The cables 200 may be bundled together. Each cable subassembly 202 includes a ground bus 302 configured to be electrically connected to each of the cables 200 and electrically connected to the socket substrate 116. In the illustrated embodiment, the ground bus 302 includes a panel 304 and a plurality of ground fingers 306 extending from the panel 304. The ground fingers 306 are configured to be terminated to corresponding contact pads 280 on the socket substrate 116. For example, the ground fingers 306 may be soldered to the corresponding contact pads 280. The panel 304 electrically commons each of the ground fingers 306 to each other and to each of the cables 200. In alternative embodiments, rather than using a ground bus 302, the cables 200 may include ground conductors, such as drain wires that may be terminated to corresponding contact pads 280.

The cables 200 include cable conductors 310 configured to be terminated to corresponding contact pads 280. For example, the cable conductors 310 may be soldered to the contact pads 280. The cable conductors 310 may be exposed by stripping the ends of the cables 200. Optionally, the cables 200 may be twin-axial cables each having a pair of signal cable conductors 310 carrying differential pair signals. Optionally, each of the cables 200 may include ground cable conductors 310, such as drain wires and/or cable braids configured to be electrically connected to the ground bus 302.

Figure 9:
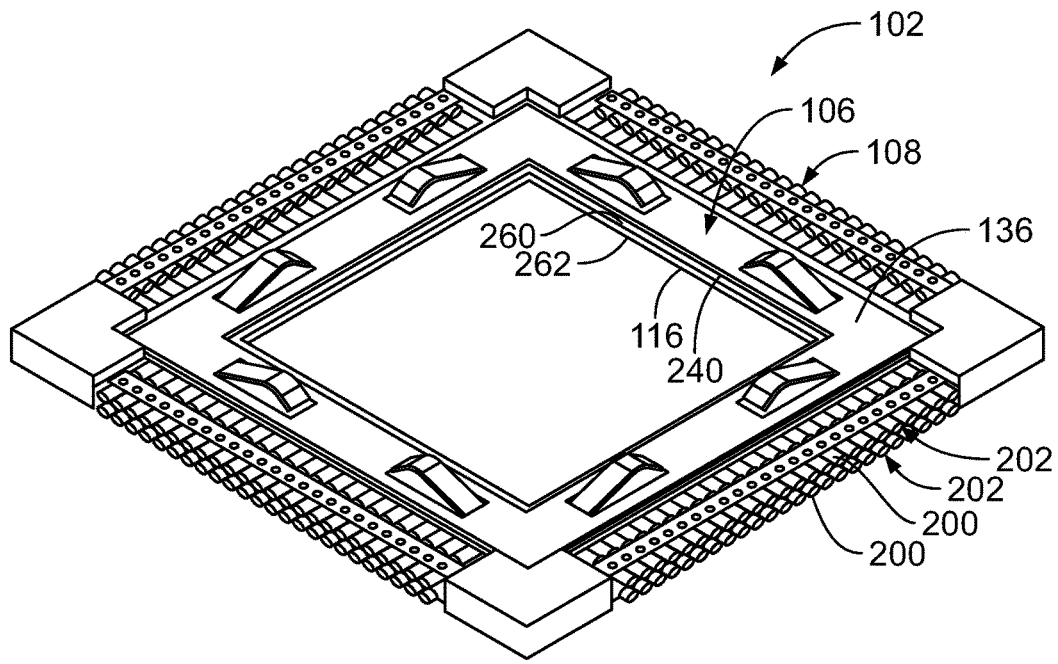
FIG. 9 is a top perspective view of the cable socket connector assembly in accordance with an exemplary embodiment.
Figure 10:
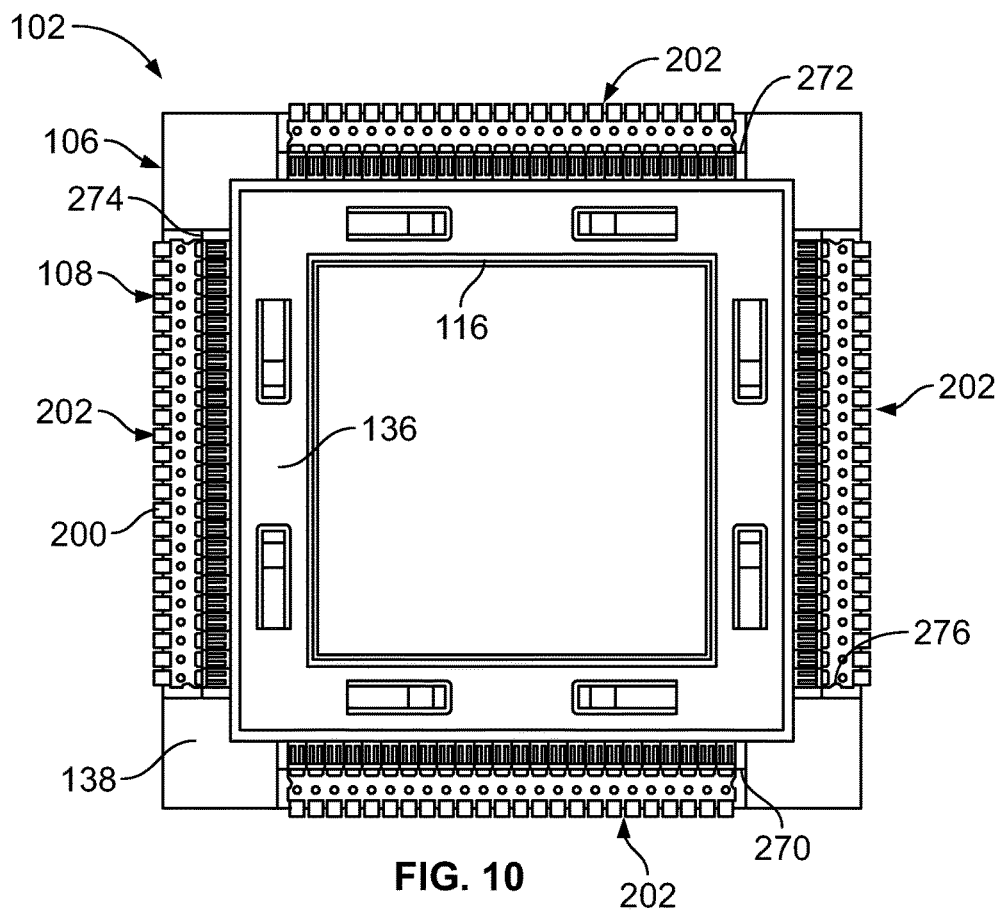
FIG. 10 is a top view of the cable socket connector assembly in accordance with an exemplary embodiment.
Figure 11:
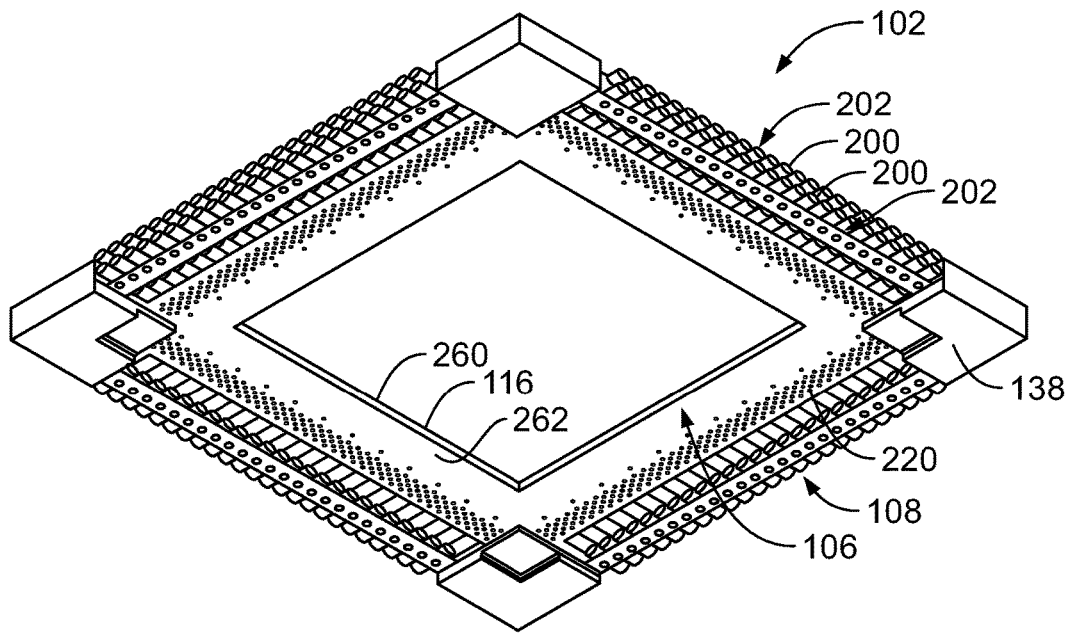
FIG. 11 is a bottom perspective view of the cable socket connector assembly in accordance with an exemplary embodiment.
Figure 12:
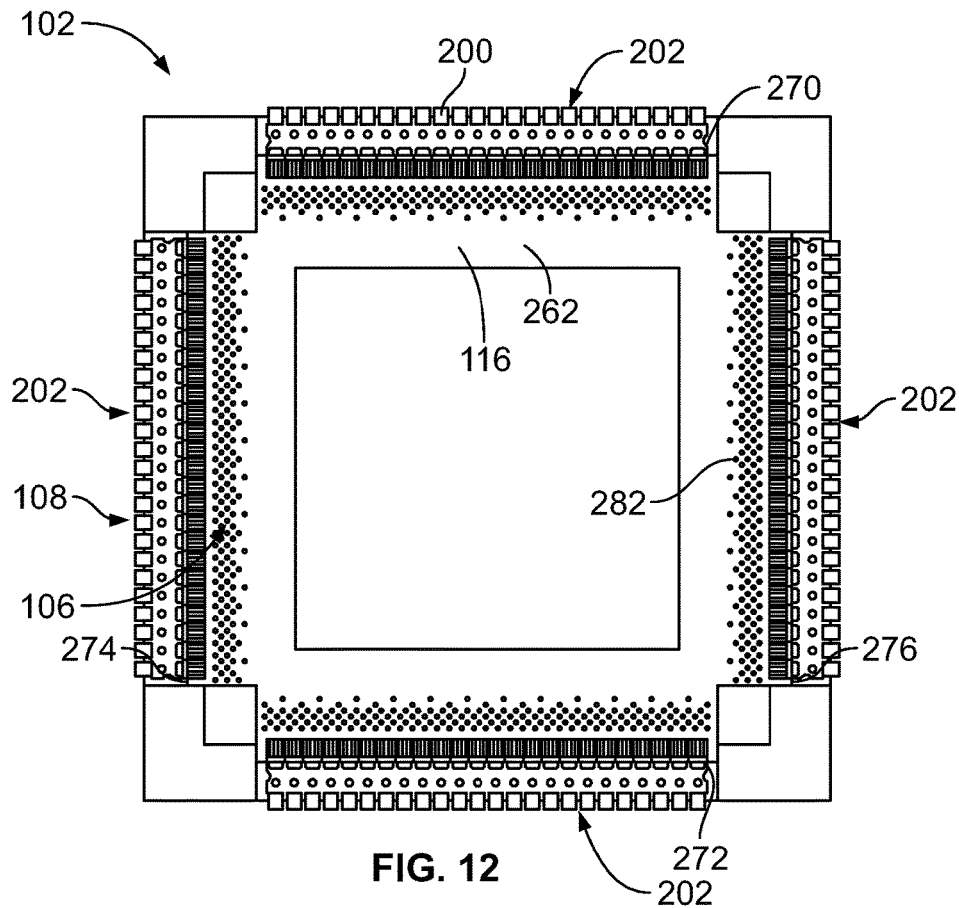
FIG. 12 is a bottom view of the cable socket connector assembly in accordance with an exemplary embodiment.

FIG. 9 is a top perspective view of the cable socket connector assembly 102 in accordance with an exemplary embodiment. FIG. 10 is a top view of the cable socket connector assembly 102 in accordance with an exemplary embodiment. FIG. 11 is a bottom perspective view of the cable socket connector assembly 102 in accordance with an exemplary embodiment. FIG. 12 is a bottom view of the cable socket connector assembly 102 in accordance with an exemplary embodiment.

When assembled, the socket substrate 116 is held in and supported by the socket frame 138. The loading member 136 and the insulator 240 are coupled to the socket substrate 116. The cable assembly 108 extends from the socket assembly 106. The cables 200 are terminated to the socket substrate conductors 118 of the socket substrate 116. The cable subassemblies 202 extend from the socket substrate 116 in respective directions. In the illustrated embodiment, cable subassemblies 202 are shown extending from all four sides of the socket substrate 116 (for example, from the first side wall 270, from the second side wall 272, from the first end wall 274 and from the second end wall 276); however, in alternative embodiments, fewer cable subassemblies 202 may be provided, such as extending from three sides, to side or a single side. In the illustrated embodiment, the cable subassemblies 202 are shown terminated to corresponding socket substrate conductors 118 on the upper surface 260 and on the lower surface 262; however, in alternative embodiments, cable subassemblies 202 may be provided only on the upper surface 260 or only on the lower surface 262.

In an exemplary embodiment, the bottom of the cable socket connector assembly 102 is configured to be electrically connected to the electronic package 104. As such, the socket contacts 220 (FIG. 11) extend from the lower surface 262 of the socket substrate 116. The socket contacts 220 are terminated to corresponding socket substrate conductors 118 at the lower surface 262, such as being press-fit in corresponding vias 282 (FIG. 12). The socket substrate conductors 118 on the upper surface 260 are routed through the socket substrate 116 to the lower surface 262 for electrical connection with corresponding socket contacts 220 at the lower surface 262.

Figure 13:
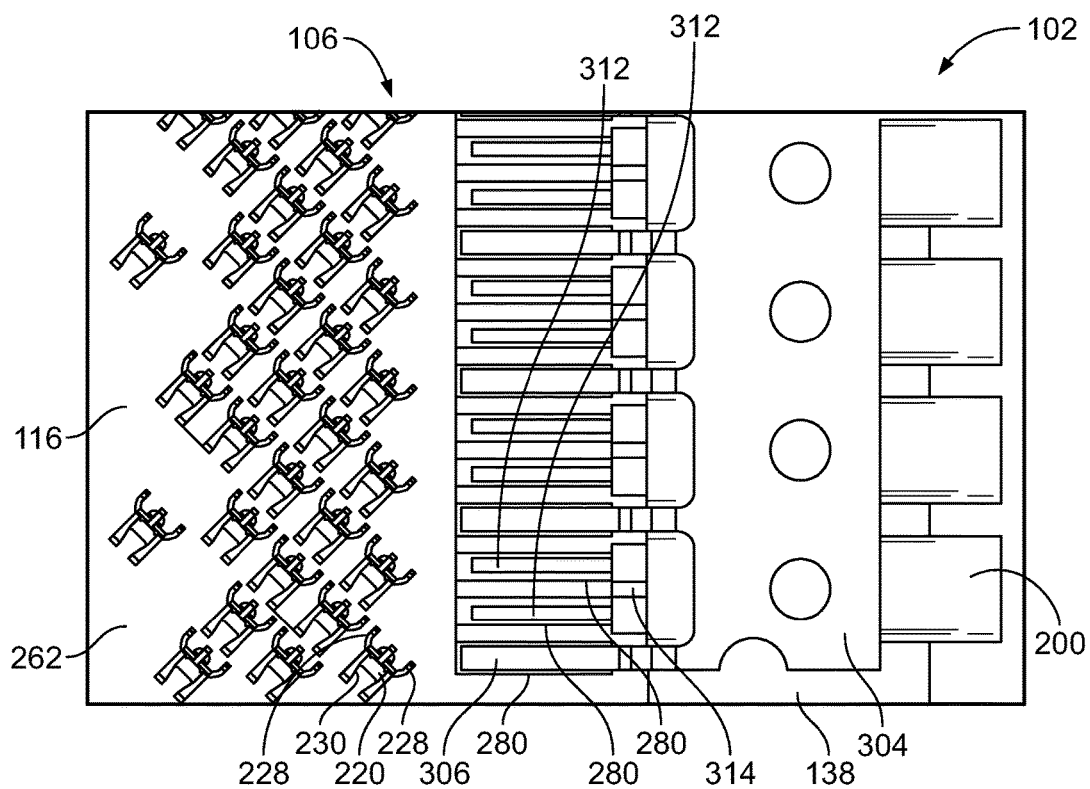
FIG. 13 is an enlarged bottom view of a portion of the cable socket connector assembly.

FIG. 13 is an enlarged bottom view of a portion of the cable socket connector assembly 102. The cables 200 are shown terminated to the socket assembly 106. In the illustrated embodiment, each cable 200 includes a pair of signal cable conductors 312 and the ground cable connector 314. The signal cable conductors 312 are stripped at the end of the cable 200 and configured to be soldered to the corresponding contact pads 280. In the illustrated embodiment, the ground cable conductor 314 includes a drain wire and/or a cable braid of the cable 200. The ground cable conductor 314 is electrically connected to the panel 304 of the ground bus 302. The ground fingers 306 extend from the panel 304 for termination to the corresponding contact pad 280. Optionally, the ground fingers 306 may be soldered to the contact pads 280. In the illustrated embodiment, the contact pads 280 are arranged in a ground-signal-signal-ground arrangement for termination to the signal cable conductors 312 and the ground cable conductors 314. Optionally, the cable socket connector assembly 102 may include one or more strain relief features for securing the cables 200 to the socket assembly 106. The strain relief features may extend from or be connected to the socket frame 138.

The socket contacts 220 extend from the lower surface 262 of the socket substrate 116. The stabilizing beams 228 stabilize the socket contacts 220 at the lower surface 262. The spring beams 230 extend below the lower surface 262 and position the socket contacts 220 for electrical connection with the electronic package 104. The socket contacts 220 are arranged in an array, such as a grid. The socket contacts 220 may be signal socket contacts or ground socket contacts. Optionally, the signal socket contacts may be arranged in pairs surrounded by corresponding ground socket contacts, which provide electrical shielding between corresponding signal socket contacts. The socket contacts 220 may include power socket contacts. The socket contacts 220 are electrically terminated to corresponding contact pads 280 on the upper surface 260 or the lower surface 262. The socket contacts 220 correlate to package contacts 156 (for example, SMT pads) on the upper surface 152 of the electronic package 104.

Figure 14:
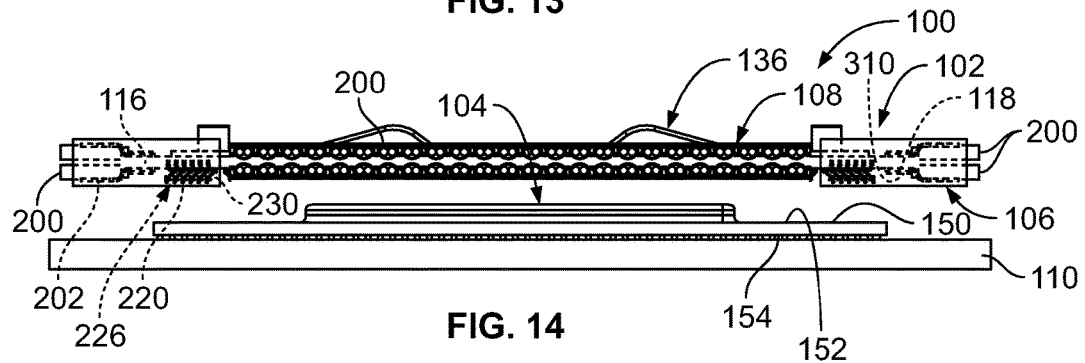
FIG. 14 is a side view of a portion of the electronic system showing the cable socket connector assembly poised for mating with an electronic package.
Figure 15:
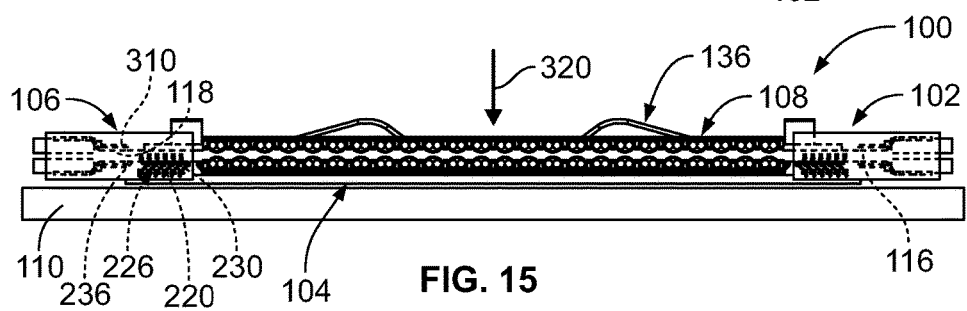
FIG. 15 is a side view of a portion of the electronic system showing the cable socket connector assembly mated with the electronic package.
Figure 16:
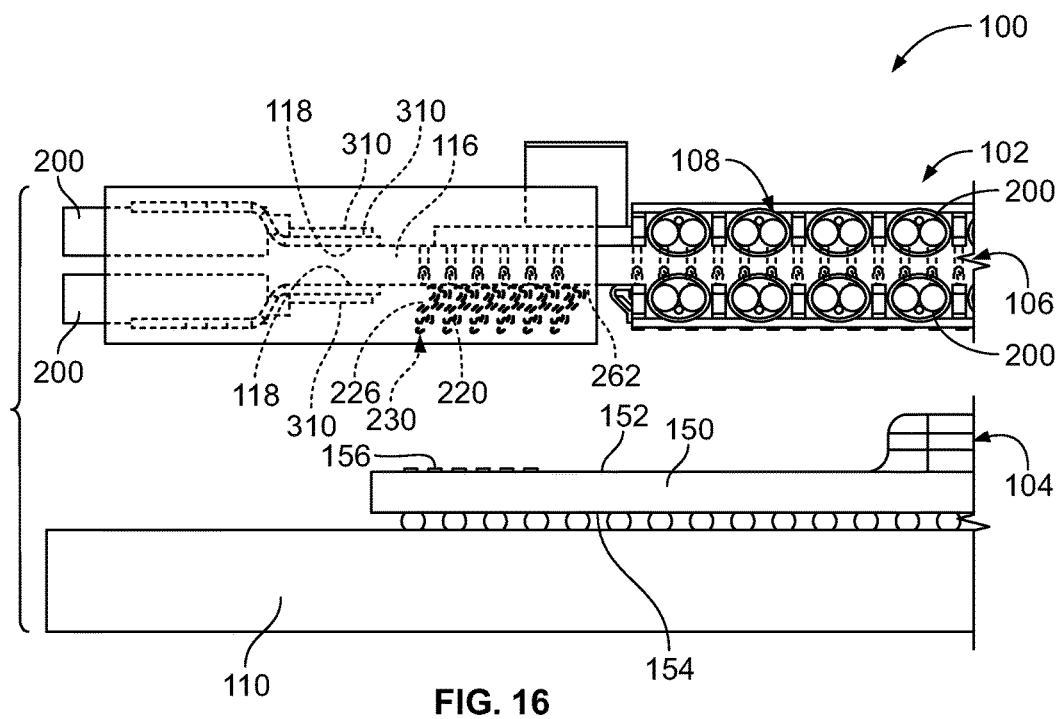
FIG. 16 is an enlarged side view of a portion of the electronic system showing the cable socket connector assembly poised for mating with the electronic package.
Figure 17:
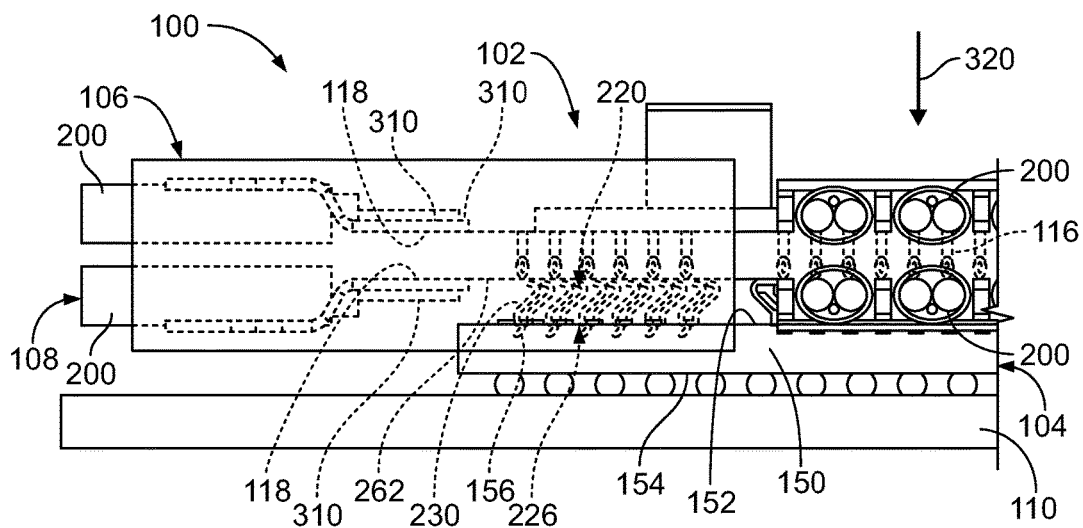
FIG. 17 is an enlarged side view of a portion of the electronic system showing the cable socket connector assembly mated with the electronic package.

FIG. 14 is a side view of a portion of the electronic system 100 showing the cable socket connector assembly 102 poised for mating with the electronic package 104. FIG. 15 is a side view of a portion of the electronic system 100 showing the cable socket connector assembly 102 mated with the electronic package 104. FIG. 16 is an enlarged side view of a portion of the electronic system 100 showing the cable socket connector assembly 102 poised for mating with the electronic package 104. FIG. 17 is an enlarged side view of a portion of the electronic system 100 showing the cable socket connector assembly 102 mated with the electronic package 104.

During mating, the cable socket connector assembly 102 is aligned with the electronic package 104 and lowered onto the electronic package 104. The socket contacts 220 are used to electrically connect to the socket assembly 106 and the electronic package 104. The socket contacts 220 extend from the lower surface 262 of the socket substrate 116 and are spring loaded against the substrate 150 of the electronic package 104. The spring beams 230 are deflectable between the socket substrate 116 and the substrate 150 of the electronic package 104. The mating ends 226 of the socket contacts 220 are aligned with corresponding package contacts 156 on the upper surface 152 of the substrate 150 of the electronic package 104. The socket assembly 106 is configured to be compressed in a downward direction 320 to deflect the socket contacts 220 and spring load the socket contacts 220 against the electronic package 104. For example, the heat sink 130 may press downward against the socket assembly 106. In an exemplary embodiment, the loading member 136 distributes the load from the heat sink 130 to press the socket assembly 106 downward and compress the socket contacts 220. In other various embodiments, rather than having compressible socket contacts 220, the socket contacts 220 may be solder balls, such as a BGA, configured to be soldered to the electronic package 104.

The socket assembly 106 is used to directly attach the cables 200 of the cable assembly 108 to the electronic package 104. The cable conductors 310 are electrically connected to corresponding package contacts 156 of the electronic package 104 through the socket contacts 220 and the socket substrate conductors 118. The electrical paths to not pass through the host circuit board 110 to the cable assembly 108. The electrical paths between the cable conductors 310 and the electronic package 104 are short and have few electrical interfaces. The electronic system 100 provides good electrical performance for the high speed signals from the electronic package 104. The electronic system 100 provide electrical connection to the upper surface 152 and the lower surface 154 of the substrate 150 of the electronic package 104 to provide higher density and/or a smaller footprint. By connecting the cables 200 of the cable assembly 108 to the socket assembly 106, the electronic system 100 eliminates the need to route the high speed signals through the host circuit board 110 and/or through a separate electrical connector mounted to the host circuit board 110, eliminating expense of components and assembly of components to reduce cost.

Figure 18:
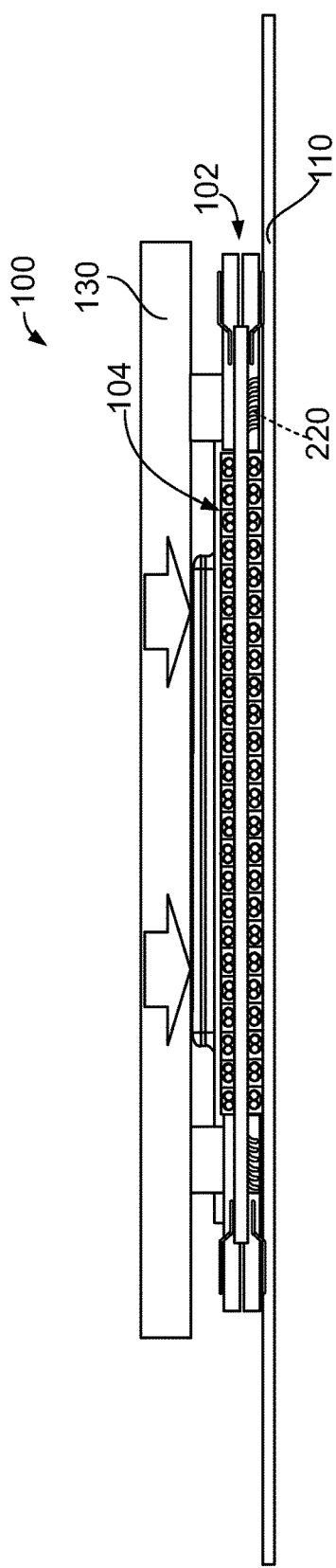
FIG. 18 is a side view of a portion of the electronic system in accordance with an exemplary embodiment.

FIG. 18 is a side view of a portion of the electronic system 100 showing the cable socket connector assembly 102 mated with the electronic package 104 and the host circuit board 110 in accordance with an exemplary embodiment. In the illustrated embodiment, the electronic package 104 is mated to the top of the cable socket connector assembly 102 and the cable socket connector assembly 102 is mated to the top of the host circuit board 110. For example, socket contacts 220 (shown in FIG. 6) may be provided on the top and the bottom of the socket substrate 116. The heat sink 130 may be thermally coupled to the electronic package 104.

Figure 19:
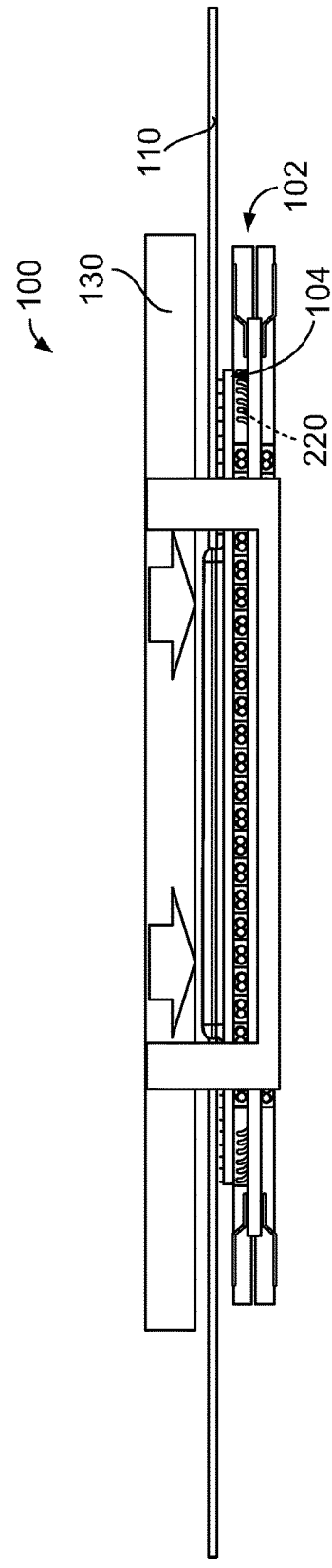
FIG. 19 is a side view of a portion of the electronic system in accordance with an exemplary embodiment.

FIG. 19 is a side view of a portion of the electronic system 100 showing the cable socket connector assembly 102 mated with the electronic package 104 and showing the electronic package 104 mated with the host circuit board 110 in accordance with an exemplary embodiment. In the illustrated embodiment, the electronic package 104 is mated to the top of the cable socket connector assembly 102. For example, socket contacts 220 (shown in FIG. 6) may be provided on the top of the socket substrate 116 to mate to the bottom of the electronic package 104. The electronic package 104 is mated to the bottom of the host circuit board 110, such as using a ball grid array. The heat sink 130 may be thermally coupled to the electronic package 104.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable socket connector assembly for an electronic system comprising:
   a socket assembly comprising a socket substrate having socket substrate conductors, the socket assembly having socket contacts extending between terminating ends and mating ends, the terminating ends being terminated to corresponding socket substrate conductors, the mating ends being configured to be terminated to corresponding package contacts of an electronic package of the electronic system, the socket contacts comprise signal socket contacts and ground socket contacts, the signal socket contacts being arranged in pairs; and
   a cable assembly terminated to the socket assembly, the cable assembly having an array of cables, each cable having a cable conductor terminated to a corresponding socket substrate conductor, the cable conductors comprising signal cable conductors and ground cable conductors, the signal cable conductors being arranged in pairs in each cable, the signal cable conductors being terminated to corresponding signal socket contacts and the ground cable conductors being terminated to corresponding ground socket contacts;
   wherein the socket contacts and the corresponding socket substrate conductors define electrical paths between the cable conductors of the cables and the package conductors of the electronic package.

2. The cable socket connector assembly of claim 1, wherein the mating ends of the socket contacts directly engage the package contacts of the electronic package to electrically connect the socket assembly to the electronic package and the cable conductors of the cables directly engage the socket substrate conductors to electrically connect the cable assembly to the socket assembly.

3. The cable socket connector assembly of claim 1, wherein the mating ends of the socket contacts include spring beams configured to be resiliently deflected against the electronic package.

4. The cable socket connector assembly of claim 1, further comprising a loading member engaging the socket assembly, the loading member having at least one loading beam imparting a downward spring force on the socket substrate to bias the socket contacts against the package contacts of the electronic package.

5. The cable socket connector assembly of claim 1, wherein the cable conductors are soldered to the corresponding socket substrate conductors.

6. The cable socket connector assembly of claim 1, wherein the socket contacts are configured to be spring loaded against corresponding package contacts of the electronic package at a separable mating interface.

7. The cable socket connector assembly of claim 1, wherein the socket substrate includes outer edges defining an outer perimeter and inner edges defining a socket opening configured to receive the electronic package, the socket substrate conductors being arranged along at least one of the outer edges, the signal contacts being arranged along at least one of the inner edges.

8. The cable socket connector assembly of claim 1, wherein the socket substrate includes a socket opening therethrough configured to receive the electronic package.

9. The cable socket connector assembly of claim 1, wherein the socket assembly and the cable assembly are configured to be received in a gap between the electronic package and a heat sink thermally coupled to the electronic package.

10. The cable socket connector assembly of claim 1, further comprising a socket frame receiving and supporting the socket substrate, the socket frame extending between a top and a bottom, the socket frame having a heat sink locating surface at the top configured to engage and locate a heat sink relative to the socket frame, the socket frame having an electronic package locating surface at the bottom configured to engage and locate the electronic package relative to the socket frame.

11. The cable socket connector assembly of claim 1, wherein the socket substrate includes first and second side walls and first and second end walls, the socket substrate conductors being arranged along at least one of the first and second side walls.

12. The cable socket connector assembly of claim 11, wherein the socket substrate conductors are arranged along at least one of the first and second end walls.

13. The cable socket connector assembly of claim 1, wherein the socket substrate includes an upper surface and a lower surface, the socket contacts extending from the lower surface to engage an upper surface of the electronic package.

14. The cable socket connector assembly of claim 13, wherein the socket substrate conductors have plated vias, the terminating ends of the socket contacts being received in corresponding plated vias.

15. The cable socket connector assembly of claim 13, wherein the socket substrate conductors include contact pads on at least one of the upper surface and the lower surface, the cable conductors being terminated to corresponding contact pads of the socket substrate conductors.

16. A cable socket connector assembly for an electronic system comprising:
a socket assembly comprising a socket frame, a socket substrate received in and supported by the socket frame, socket contacts terminated to the socket substrate and a loading member coupled to the socket substrate, the socket substrate having socket substrate conductors defined by circuits of the substrate, the socket contacts extend between terminating ends and mating ends and include spring beams at the mating ends, the terminating ends being terminated to corresponding socket substrate conductors, the mating ends configured to be terminated to corresponding package contacts of an electronic package of the electronic system with the spring beams being deflectable between the socket substrate and the electronic package to spring load the mating ends in electrical contact with the corresponding package contacts, the loading member having at least one loading beam imparting a downward spring force on the socket substrate to deflect the spring beams of the socket contacts, the socket frame extending between a top and a bottom, the socket frame having a heat sink locating surface at the top configured to engage and locate a heat sink relative to the socket frame, the socket frame having an electronic package locating surface at the bottom configured to engage and locate the electronic package relative to the socket frame; and
a cable assembly terminated to the socket assembly, the cable assembly having an array of cables, each cable having a cable conductor terminated to a corresponding socket substrate conductor;
wherein the socket contacts and the corresponding socket substrate conductors define electrical paths between the cable conductors of the cables and the package conductors of the electronic package.

17. The cable socket connector assembly of claim 16, wherein the socket contacts comprise signal socket contacts and ground socket contacts, the signal socket contacts being arranged in pairs, the cable conductors comprising signal cable conductors and ground cable conductors, the signal cable conductors being arranged in pairs in each cable, the signal cable conductors being terminated to corresponding signal socket contacts and the ground cable conductors being terminated to corresponding ground socket contacts.

18. The cable socket connector assembly of claim 17, wherein the mating ends of the socket contacts directly engage the package contacts of the electronic package to electrically connect the socket assembly to the electronic package and the cable conductors of the cables directly engage the socket substrate conductors to electrically connect the cable assembly to the socket assembly.

19. The cable socket connector assembly of claim 17, wherein the socket substrate includes an upper surface and a lower surface, the socket contacts extending from the lower surface to engage an upper surface of the electronic package, the socket substrate conductors include contact pads on at least one of the upper surface and the lower surface, the cable conductors being terminated to corresponding contact pads of the socket substrate conductors.

20. An electronic system comprising:
a host circuit board having host contacts;
an electronic package coupled to the host circuit board, the electronic package having a substrate including upper package contacts on an upper surface of the substrate and lower package contacts on a lower surface of the substrate, the lower package contacts being electrically connected to corresponding host contacts; and
a cable socket connector assembly coupled to the electronic package, the cable socket connector assembly having a socket assembly and a cable assembly terminated to the socket assembly, the socket assembly including a socket substrate having socket substrate conductors, the socket assembly having socket contacts terminated to corresponding socket substrate conductors, the socket contacts having mating ends terminated to corresponding upper package contacts, the cable assembly having an array of cables, each cable having a cable conductor terminated to a corresponding socket substrate conductor, wherein the socket contacts comprise signal socket contacts and ground socket contacts, the signal socket contacts being arranged in pairs, the cable conductors comprising signal cable conductors and ground cable conductors, the signal cable conductors being arranged in pairs in each cable, the signal cable conductors being terminated to corresponding signal socket contacts and the ground cable conductors being terminated to corresponding ground socket contacts.

21. The electronic system of claim 20, wherein the host circuit board is a mother board and electrical paths are defined between the electronic package and the motherboard through the lower package contacts, the cable conductors defining electrical paths with the upper package contacts through the socket contacts and the socket substrate conductors without passing through the motherboard.

22. The electronic system of claim 20, wherein the electronic package is sandwiched between the host circuit board and the socket substrate.

23. The electronic system of claim 20, wherein the substrate of the electronic package is positioned below the socket substrate and the host circuit board is positioned below the substrate of the electronic package, the electronic system further comprising a heat sink above the cable socket connector assembly thermally coupled to the electronic package through a socket opening in the socket substrate.

24. The electronic system of claim 20, wherein the mating ends of the socket contacts include spring beams configured to be resiliently deflected against the electronic package.

25. The electronic system of claim 20, wherein the cable socket connector assembly further comprises a loading member engaging the socket assembly, the loading member having at least one loading beam imparting a downward spring force on the socket substrate to bias the socket contacts against the upper package contacts of the electronic package.

* * * * *